US012643692B2

(12) United States Patent
Sarpotdar

(10) Patent No.: US 12,643,692 B2
(45) Date of Patent: *Jun. 2, 2026

(54) SHAPE MEMORY ALLOY (SMA) PASSIVE TEMPERATURE CONTROL SYSTEMS AND METHODS FOR AIRCRAFT ELECTRICAL SYSTEMS

(71) Applicant: Aurora Flight Sciences Corporation, a subsidiary of The Boeing Company, Manassas, VA (US)

(72) Inventor: Shekhar Sarpotdar, Bethedsa, MD (US)

(73) Assignee: Aurora Flight Sciences Corporation, a subsidary of The Boeing Company, Manassas, VA (US)

( * ) Notice: Subject to any disclaimer, the term of this patent is extended or adjusted under 35 U.S.C. 154(b) by 278 days.

This patent is subject to a terminal disclaimer.

(21) Appl. No.: 18/601,233

(22) Filed: Mar. 11, 2024

(65) Prior Publication Data

US 2024/0217663 A1 Jul. 4, 2024

Related U.S. Application Data

(63) Continuation of application No. 17/409,700, filed on Aug. 23, 2021, now Pat. No. 11,993,384.

(Continued)

(51) Int. Cl.
*B64U 20/90* (2023.01)
*B60L 58/26* (2019.01)
(Continued)

(52) U.S. Cl.
CPC .............. *B64U 20/90* (2023.01); *B60L 58/26* (2019.02); *H01M 6/5038* (2013.01);
(Continued)

(58) Field of Classification Search
CPC ..... B64U 20/90; B60L 58/26; B60L 2200/10; H01M 6/5038; H01M 10/613;
(Continued)

(56) References Cited

U.S. PATENT DOCUMENTS 5,535,815 A 7/1996 Hyman
7,007,501 B2 3/2006 Hu
(Continued)

FOREIGN PATENT DOCUMENTS

KR 20190041727 A * 4/2019 .......... H01M 10/625

OTHER PUBLICATIONS https://www.1-act.com/innovations/thermal-storage/thermal-storage-with-venting/single-use-vapor-venting-systems-for-thermal-storage-one-to-a-few-cycles/ accessed Jun. 15, 2020, 6 pages.
(Continued)

*Primary Examiner* — Robert J Hoffberg
(74) *Attorney, Agent, or Firm* — Hanley, Flight & Zimmerman, LLC

(57) ABSTRACT

Presented are passive temperature control systems for thermal management of electrical components, methods for making/using such thermal management systems, and aircraft equipped with smart-material activated temperature control systems for passive cooling of battery modules. A thermal management system is presented for passively cooling an electrical component stored inside a module housing. The thermal management system includes a cooling chamber that movably attaches adjacent a module housing that contains an electrical component, such as a rechargeable battery module. The cooling chamber contains a sublimable cooling agent, such as dry ice. A biasing member biases the cooling chamber away from the module housing. A smart material actuator is attached to and interposed between the cooling chamber and module housing. The smart material
(Continued)

actuator extracts thermal energy from the module housing and, once heated to a phase transformation temperature, contracts and thereby pulls the cooling chamber into contact with the module housing.

20 Claims, 3 Drawing Sheets

Related U.S. Application Data

(60) Provisional application No. 63/133,555, filed on Jan. 4, 2021.

(51) Int. Cl.

| | |
|---|---|
| *H01M 6/50* | (2006.01) |
| *H01M 10/613* | (2014.01) |
| *H01M 10/637* | (2014.01) |
| *H01M 50/249* | (2021.01) |
| *H05K 7/20* | (2006.01) |

(52) U.S. Cl.
CPC ....... *H01M 10/613* (2015.04); *H01M 10/637* (2015.04); *H01M 50/249* (2021.01); *H05K 7/2029* (2013.01); *B60L 2200/10* (2013.01); *H01M 2220/20* (2013.01)

(58) Field of Classification Search
CPC ............. H01M 10/637; H01M 50/249; H01M 2220/20; H05K 7/2029
See application file for complete search history.

(56) References Cited

U.S. PATENT DOCUMENTS

| | | | | |
|---|---|---|---|---|
| 7,480,141 | B2 * | 1/2009 | Takenoshita ............ | G06F 1/203 |
| | | | | 349/161 |
| 7,655,001 | B2 | 2/2010 | Petrakis | |
| 8,172,458 | B2 | 5/2012 | Petrakis | |
| 8,217,629 | B2 * | 7/2012 | Pinto, IV ............ | H01M 10/441 |
| | | | | 320/152 |
| 9,114,881 | B2 | 8/2015 | Mar | |
| 9,986,822 | B2 | 6/2018 | Burgess et al. | |
| 10,207,807 | B2 | 2/2019 | Moran et al. | |
| 11,309,588 | B1 * | 4/2022 | Sala ........................ | H01M 4/14 |
| 11,622,063 | B2 | 4/2023 | Schieltz | |
| 11,752,898 | B2 | 9/2023 | Fan et al. | |
| 11,993,384 | B2 * | 5/2024 | Sarpotdar ......... | H01M 10/6569 |
| 12,168,975 | B2 * | 12/2024 | Yang ..................... | F03G 7/0616 |
| 12,308,404 | B2 * | 5/2025 | Ressler .............. | H01M 50/209 |
| 2005/0074666 | A1 | 4/2005 | Kimiya et al. | |
| 2008/0079129 | A1 | 4/2008 | Ganapathysubramanian et al. | |
| 2010/0062321 | A1 | 3/2010 | Nakamura | |
| 2019/0165408 | A1 | 5/2019 | Andryukov et al. | |
| 2022/0065233 | A1 | 3/2022 | Yang et al. | |
| 2023/0238632 | A1 * | 7/2023 | Kritzer ............... | H01M 10/613 |
| | | | | 429/62 |
| 2023/0395898 | A1 | 12/2023 | Hermle et al. | |

OTHER PUBLICATIONS

United States Patent and Trademark Office, "Notice of Allowance," issued Jan. 24, 2024 in connection with U.S. Appl. No. 17/409,700, 12 pages.
United States Patent and Trademark Office, "Restriction Requirement," issued Nov. 21, 2023 in connection with U.S. Appl. No. 17/409,700, 7 pages.

* cited by examiner

SHAPE MEMORY ALLOY (SMA) PASSIVE TEMPERATURE CONTROL SYSTEMS AND METHODS FOR AIRCRAFT ELECTRICAL SYSTEMS

CLAIM OF PRIORITY AND CROSS-REFERENCE TO RELATED APPLICATIONS

This application is a continuation of U.S. patent application Ser. No. 17/409,700, which was filed on Aug. 23, 2021, is now allowed, and claims the benefit of priority to U.S. Provisional Patent App. No. 63/133,555, which was filed on Jan. 4, 2021. Both of the foregoing patent applications are incorporated herein by reference in their respective entireties and for all purposes.

TECHNICAL FIELD

The present disclosure relates generally to electrical systems of aircraft. More specifically, aspects of this disclosure relate to thermal management systems and methods for passive cooling of battery modules and electrical hardware of unmanned aerial vehicles.

BACKGROUND

Many commercially available UAVs employ a rechargeable battery module to store and supply the requisite power for operating the electric motor unit or units used to propel the aircraft. In order to generate power with sufficient flight range without drastically increasing the aircraft's all-up weight (AUW), each battery module is smaller yet significantly more powerful and higher in capacity (Amp-hr) than a standard 12-volt lead-acid battery. Modern UAV battery packs group stacks of discretely packaged battery cells into one or more individual battery modules that are mounted onto the airframe, e.g., inside a dedicated compartment or on a load-bearing support tray. A high-voltage electrical system governs the transfer of electricity between the battery module(s) and electric motor(s). The electric system may employ a front-end DC-to-DC power converter that increases the pack voltage supply to a main direct current (DC) bus and a power inverter module (PIM). Operation and control of each electric motor unit may be accomplished by employing the PIM to transform DC electric power to alternating current (AC) power using pulse-width modulated control signals output from a Battery Pack Controller (BPC).

SUMMARY

Presented herein are passive temperature control systems for thermal management of electrical systems, methods for making and methods for using such temperature control systems, and aircraft equipped with smart-material activated temperature control systems for passive cooling of battery modules.

Figure 1:
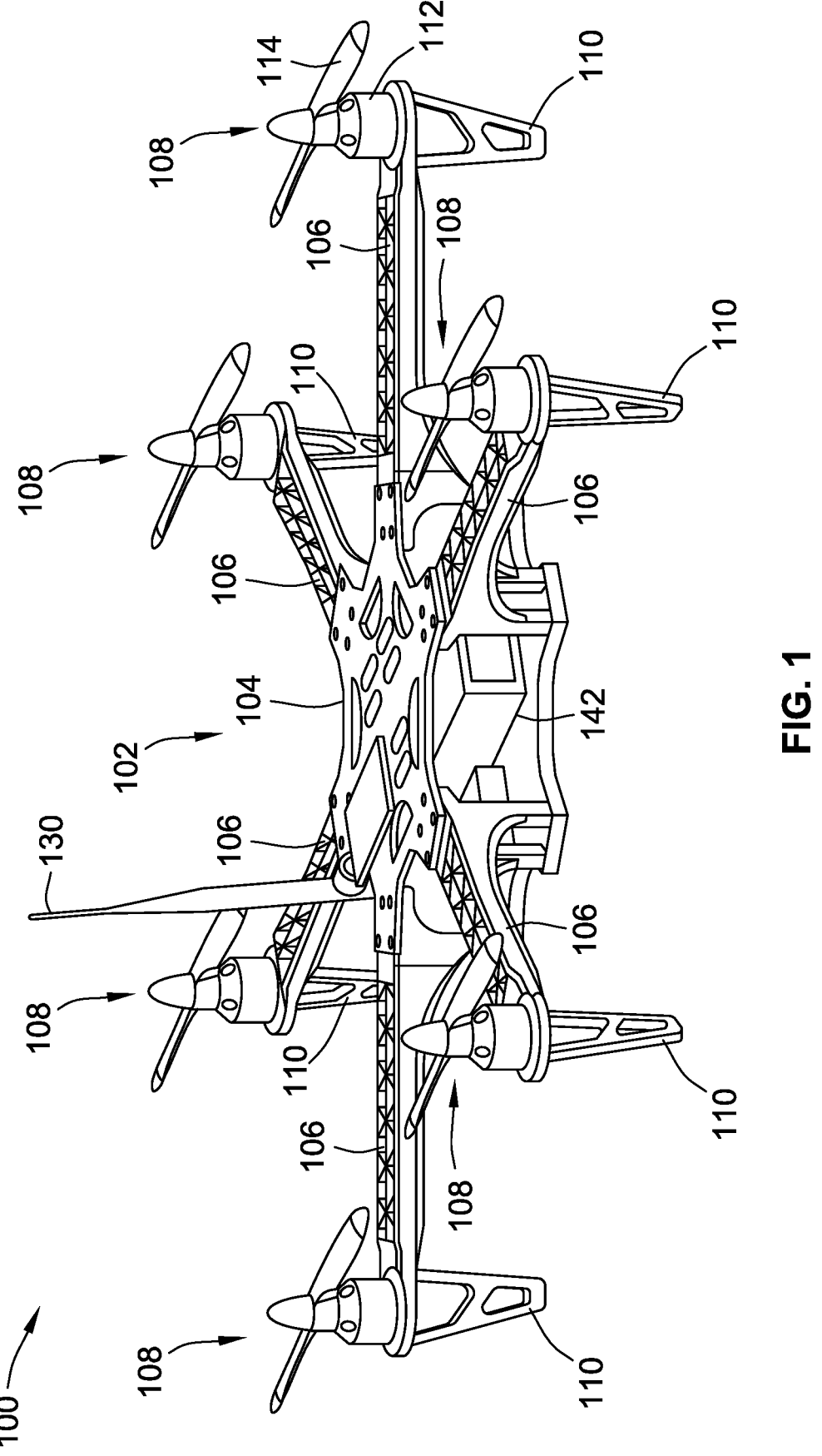
FIG. 1 is an elevated, perspective-view illustration of a representative aircraft with a rechargeable battery module in accordance with aspects of the present disclosure.

The present disclosure is amenable to various modifications and alternative forms, and some representative embodiments are shown by way of example in the drawings and will be described in detail below. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed, for example, by the appended claims.

DETAILED DESCRIPTION

This disclosure is susceptible of embodiment in many different forms. Representative examples of the disclosure are shown in the drawings and herein described in detail with the understanding that these embodiments are provided as an exemplification of the disclosed principles, not limitations of the broad aspects of the disclosure. To that end, elements and limitations that are described, for example, in the Abstract, Technical Field, Background, Summary, Description of the Drawings, and Detailed Description sections, but not explicitly set forth in the claims, should not be incorporated into the claims, singly or collectively, by implication, inference or otherwise. Moreover, the drawings discussed herein are not necessarily to scale and are provided purely for instructional purposes. Thus, the specific and relative dimensions shown in the drawings are not to be construed as limiting.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, front, back, left, right, etc., may be with respect to an aircraft that is operatively oriented in an upright position on a horizontal support surface.

Referring now to the drawings, wherein like reference numbers refer to like features throughout the several views, there is shown in FIG. 1 a representative aircraft, which is designated generally at 100 and portrayed herein for purposes of discussion as a multi-rotor vertical takeoff and landing unmanned aerial vehicle. The illustrated VTOL aircraft 100—also referred to herein as "vehicle" or "UAV" for brevity—is merely an exemplary application with which aspects and features of this disclosure may be practiced. In the same vein, utilization of the present concepts for passive cooling of a UAV battery module should also be appreciated as an exemplary implementation of the concepts disclosed herein. As such, it will be understood that aspects of the present disclosure may be implemented for cooling other electrical system hardware and architectures, may be incorporated into any logically relevant type of aircraft, and may be utilized in both vehicular and non-vehicular applications alike. Lastly, only select components have been shown and will be described in additional detail herein. Nevertheless, the systems, methods, devices, and aircraft discussed below may include numerous additional and alternative features, and other available peripheral components, for carrying out the various functions of this disclosure.

UAV 100 of FIG. 1 is shown as a cargo drone with a load-bearing airframe 102 that is generally composed of a central fuselage 104 and a circular array of (six) rotor booms 106. Projecting orthogonally from a terminal end of each boom 106 is a fixed skid-type landing gear 110. Also cantilevered to the fuselage 104 at the terminal ends of the booms 106 are motor-driven rotor assemblies 108. While a six-rotor (hexarotor) cargo drone is illustrated in the Figures, the UAV 100 may take on alternative aircraft configurations and size classifications, may employ greater or fewer than six rotors, and may employ various control surfaces and lifting surfaces.

Rotor assemblies 108 of FIG. 1 may be operated individually, jointly, and in assorted combinations to provide lift and thrust to the UAV 100. Each rotor assembly 108 may be typified by a lift motor 112 that drives a multi-blade propeller assembly 114 mounted at a distal end of a mast shaft (not visible).

These hingeless "simple" rotor assemblies 108 are each juxtaposed with a landing gear 110 at the distal end of a rotor boom 106 and vertically oriented to direct thrust forces downward relative to the airframe 102. The lift motors 112 may be embodied as brushless permanent magnet (PM) electric motors controlled via an electronic speed controller (ESC). While shown packaged at the distal end of each boom 106, the six lift motors 112 (or a single, shared lift motor) may instead be located on the fuselage 104 of the airframe 102. As a further option, torque generated via a lift motor 112 may be transmitted to one or more propeller assemblies 114 via a drive belt/chain, gearbox, or power-shifted transmission interposed between the motor 112 and propeller(s) 114. Propeller assembly 114 speed and, thus, rotor assembly 108 output may be controlled by modulating power supplied to each lift motor 112 from a resident rechargeable energy storage system (RESS), represented in FIG. 1 as a lithium-ion (Li-ion) or silicon-based Li-ion (secondary) battery module 142.

At present, many commercially available UAVs do not offer thermal management for the electrical hardware components of the aircraft's electrical system. Some UAVs rely on thermal inertia of the battery module and module housing to limit spikes in battery cell temperature. Convective (air) cooling, liquid (water/glycol) cooling, and compressor-based (refrigerant) cooling are other available techniques that may be used for heat abatement in UAV applications. Such passive cooling systems, however, have low heat transfer coefficient and, thus, are unable to cope with high current draw systems, which may lead to poor battery efficiency and irrecoverable capacity fade over the life of a battery module. Likewise, many available active cooling systems are not practical due to UAV packaging and weight constraints and may be prone to multiple failure paths due to the use of dedicated electronics and moving parts.

Presented herein are smart-material activated passive temperature control systems for thermal management of electrical systems. FIGS. 2A and 2B and FIGS. 3A and 3B, for example, illustrate two examples of thermal management systems 200 and 300, respectively, for passive cooling of an electrical system component of a vehicle, such as rechargeable battery module 142 of UAV 100 in FIG. 1. While differing in appearance, it is envisioned that the features and options disclosed herein with reference to the thermal management system 200 of FIGS. 2A and 2B may be incorporated, singly or in any combination, into the example thermal management system 300 of FIGS. 3A and 3B, and vice versa. As a point of similarity, both thermal management systems 200, 300 are portrayed cooling a respective rechargeable battery module 210 and 310. Each battery module 210, 310 may include a stack of electrochemical battery cells, such as secondary lithium ion (Li-ion) or Li-ion polymer (LiPo) soft polymer pouch cells 212 and 312. Both battery modules 210, 310 store their electrochemical battery cells 212, 312 inside a protective, electrically insulating battery module housing 214 and 314, respectively. For simplification of design and maintenance, and for reduction in cost and assembly time, each battery cell in the RESS may be substantially identical to one another. It is also envisioned that the thermal management systems 200, 300 be utilized to cool multiple battery modules (e.g., within a battery pack) and/or other electrical components (e.g., aircraft CPU, memory, flight controller, etc.) in an electrical system.

Movably mounted adjacent the module housing 214, 314 is a cooling chamber 216 and 316 that selectively thermally interfaces with and, when operatively attached, cools the battery cells 212, 312 packaged inside the housing 214, 314. It may be desirable that the cooling chamber 216, 316 be fabricated as a light-weight, liquid-sealed container with excellent mechanical and chemical resistance properties that are retained from ambient to high temperatures. For instance, the cooling chamber 216, 316 may be formed from one or more of: a thermally conductive, lightweight pitch-based carbon fiber; titanium, aluminum alloy, or other lightweight, strong, and corrosion-resistant metal or metal alloy; or polyether ether ketone (PEEK) thermoplastic polymer or other suitable polymeric materials. The thermal management system 300 may be equipped with a pressure relief valve 324 or similarly suitable venting device through which gaseous byproducts may be expelled from the cooling chamber 316. It should be appreciated that the size and shape of the cooling chamber 216, 316 may be altered and scaled, for example, to accommodate alternative applications and/or desired packaging constraints. In addition, while shown translating rectilinearly toward and away from the module housing 214, 314 (e.g., up and down in FIGS. 2B and 3B), the cooling chamber 216, 316 may rotate or slide into contact with the module housing 214, 314, e.g., in clamshell or slide top arrangements.

A hydrophobic melamine foam 218 may be disposed within the cooling chamber 216, located above and extending across a sublimable cooling agent 220, for improved chamber insulation and venting of sublimation gases.

Figures 2A, 2B:
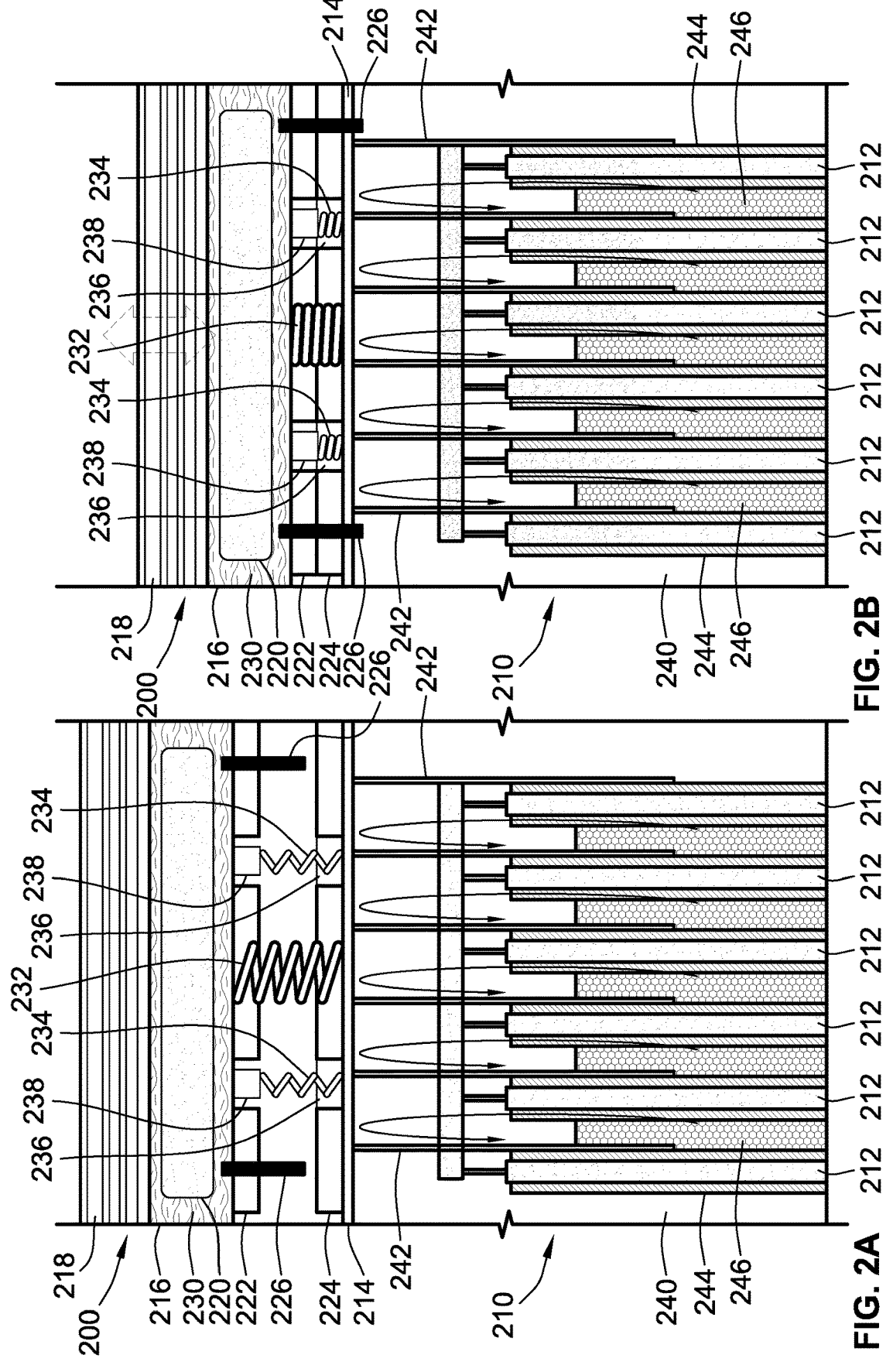
FIGS. 2A and 2B are schematic, side-view illustrations of a representative smart-material activated passive temperature control system for thermal management of an electrical component in an electrical system in accord with aspects of the disclosed concepts.
Figure 3A:
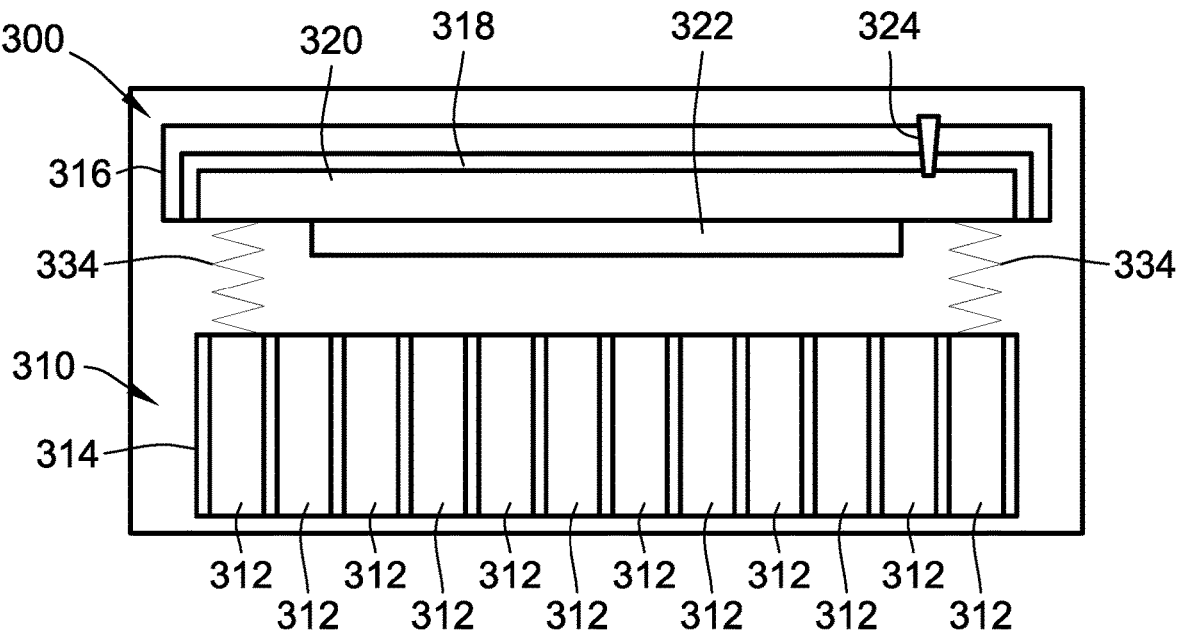
FIGS. 3A and 3B are schematic, side-view illustrations of a representative SMA thermal management system for passive cooling of a rechargeable battery module of an aircraft in accord with aspects of the disclosed concepts.
Figure 3B:
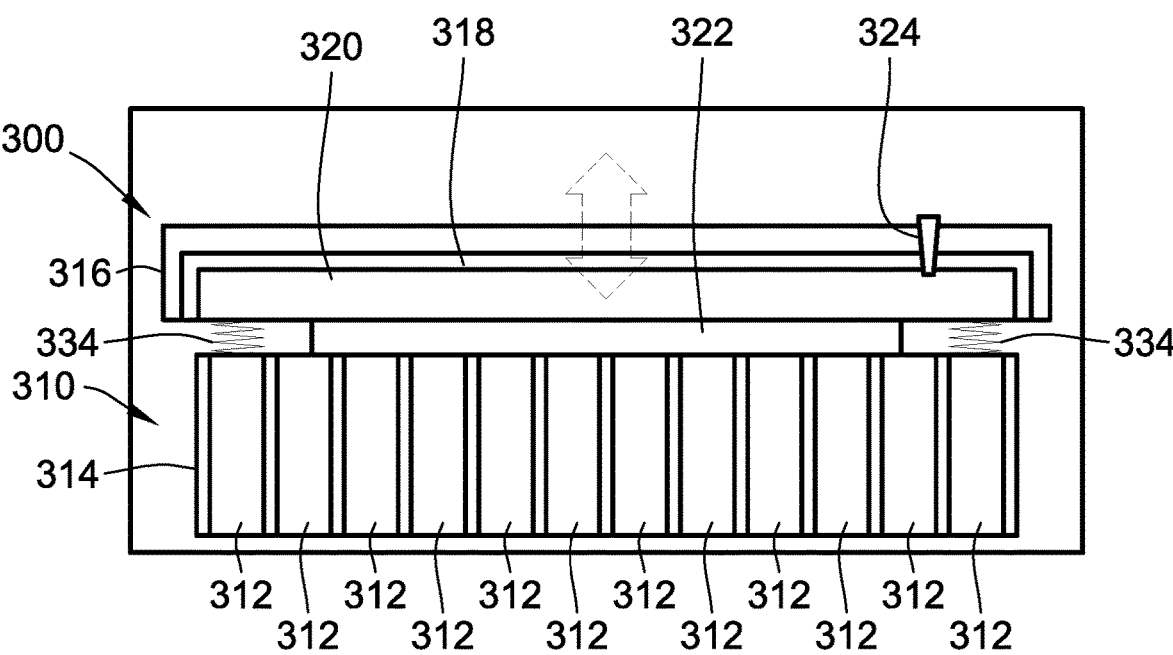

Potentially offering improved thermal contact and device-agnostic acceleration, the hydrophobic melamine foam 218 may have a density of approximately 0.31 to 0.45 lbs/ft$^3$, a temperature range of about −300° F. to about +360° F., and a thermal conductivity of about 0.2 to 0.3 BTU-in/hr ft$^2$-hr-° F. at approximately 70° F. As an alternative, a polystyrene foam or paper-based insulation jacket 318 may be used to cover a sublimable cooling agent 320 within the cooling chamber 316. For at least some configurations, such as those in which substantially all non-interfacing segments of the cooling chamber 216, 316 are formed from a thermally insulating material, a thermally conductive (bottom) wall 222, 322 may be mounted to the cooling chamber 216, e.g., along an underside thereof, to contact and thereby thermally interface with a complementary thermally conductive (top) cover 224 of the module housing 214, as best seen in FIGS. 2A and 2B.

TABLE 1

| Cooling Agent | Additive |
| --- | --- |
| dry ice | formamide |
| dry ice | cyclohexane |
| dry ice | benzene |
| dry ice | dioxane |
| dry ice | carbon tetrachloride |
| liquid $N_2$ | n-butanol |
| liquid $N_2$ | vexane |
| liquid $N_2$ | ethyl acetate |
| liquid $N_2$ | cycloheptane |

For enhanced cell safety, increased operational life expectancy, and ameliorated battery thermal limits, the cooling chambers 216, 316 of FIGS. 2A-2B and 3A-3B securely store a sublimable cooling agent 220, 320 (i.e., a coolant material capable of sublimation). In accord with the illustrated examples, the sublimable cooling agent 220, 320 is composed of a solid-form carbon dioxide material (i.e., dry ice) as a heat sink with a relatively large energy density. To improve the cooling proficiency of dry ice, the sublimable cooling agent 220 may optionally be partially or wholly immersed within a non-toxic and non-flammable dry cleaning fluid 230. By way of non-limiting example, the dry-cleaning fluid 230 may include: a tetrachloroethylene-based solvent; a petroleum-based hydrocarbon solvent; and/or a trichloroethylene-based solvent. Additional examples of appropriate cooling agent mixtures are provided above in Table 1. An advantage of solid-form carbon dioxide is that the sublimation enthalpy of dry ice is three to four times that of comparable phase change materials. Additionally, the cooling temperatures of dry ice are markedly lower than other alternative options, offering a significantly larger resultant temperature delta and, thus, increased cooling efficiency.

In order to prevent overcooling of the battery cells 212 via the sublimable cooling agent 220, one or more biasing members may separate the cooling chamber 216 from the module housing 214. With reference again to FIGS. 2A and 2B, the biasing member may take on the form of a return spring 232 that is mounted to an underside, module-facing surface of the cooling chamber 216. The illustrated return spring 232 is a helical compression spring that projects generally orthogonally from the cooling chamber 216 and presses against a topside, chamber-facing surface of the module housing 214. With this arrangement, the return spring 232 is able to maintain a desired minimum gap distance between the module housing 214 and cooling chamber 216 when the battery cells 212 are operating within a calibrated acceptable operating temperature range. While shown as a single biasing member in the form of a helical compression spring, the thermal management system 200 may employ multiple return springs 232, which may be similar or dissimilar in type and location from what is shown in the drawings. For instance, the biasing member may be a leaf spring, a torsional spring, a tension spring, or a pneumatic cylinder, and may be located along other faces of the cooling chamber 216. Alternatively, the thermal management system 300 of FIGS. 3A and 3B altogether omits a biasing member and relies, for example, on the spring force of the smart material actuators discussed below to bias the cooling chamber 316 away from the module housing 314.

A smart-material actuator extends between and operatively connects the thermal management system 200, 300 to the battery module 210, 310 to enable selective thermal communication between the cooling chamber 216, 316 and the module housing 214, 314. According to the illustrated example, a smart material actuator in the form of at least one shape memory alloy (SMA) spring 234, 334 is attached to the cooling chamber 216, 316 and thermally interfaces with the module housing 214, 314. A square array of SMA springs 234, 334 may be sandwiched between the thermal management system 200, 300 and battery module 210, 310, mounted to the underside, module-facing surface of the cooling chamber 216 and to the topside, chamber-facing surface of the module housing 214. Similar to the return spring 232, the SMA springs 234, 334 of FIGS. 2A-2B and 3A-3B are portrayed as helical compression springs that project generally orthogonally from the cooling chamber 216 and press against an opposing surface of the module housing 214. As an alternative to SMA springs, selective thermal communication between the cooling chamber 216, 316 and the module housing 214, 314 may be enabled by different smart materials, such as a shape memory polymer (SMP), a magneto-caloric alloy, thermoelectric materials, etc., and by different actuator configurations, such as leaf springs, torsional springs, engineered control arms, linear cylindrical actuators, etc.

Each SMA spring 234, 334, through contact with the battery module 210, 310, extracts thermal energy from the module housing 214, 314. Once heated to a phase transformation temperature (e.g., an austenite temperature $A_f$ at which the alloy transforms from martensite to austenite), the SMA spring 234, 334 automatically change shape. SMA springs 234 of FIGS. 2A-2B may contract and concomitantly generate a tensile spring force that pulls the cooling chamber 216 into contact with the module housing 214. Alternatively, SMA springs 334 of FIGS. 3A-3B, upon reaching the phase transformation temperature, may collapse and, thus, allow the cooling chamber 216 to descend, under the force of gravity, into contact with the module housing 214. As described above, contact between the thermally conductive wall 222 of the cooling chamber 216 with the thermally conductive cover 224 of the module housing 214 will enable thermal heat transfer from the battery cells 212 to the sublimable cooling agent 220. Embodiments employing thermally conductive module housings and chambers may eliminate the need for add-on thermal plates such that direct module-to-chamber contact will enable thermal exchanges.

Once sufficiently cooled (e.g., to a martensite temperature Mf), the SMA springs 234 return to their original, expanded state; the return spring 232 of FIGS. 2A-2B takes over and biases the cooling chamber 216 away from the module housing 214. On the other hand, SMA springs 334 of FIGS. 3A-3B, when sufficiently cooled, return to their original, expanded state and concomitantly generate a sufficient compressive force against the battery module 310 to push the cooling chamber 316 away from the module housing 314. An optional thermal grease 236 may be applied onto the distal ends of the SMA springs 234; the thermal grease 236 contacts the module housing 214 and enhances the thermal interface between the SMA springs 234 and housing 214. As yet another option, a thermally insulated stub 238 may be attached to the proximal ends of the SMA springs 234. These thermally insulated stubs 238 are interposed between and, thus, thermally isolate the SMA springs 234 and the cooling chamber 216.

With reference again to FIGS. 2A and 2B, the battery cells 212 of battery module 210 may be partially or wholly submerged in a dielectric fluid 240 that partially fills the interior cell chamber of the module housing 214. This dielectric fluid 240 may be in the nature of a non-flammable, immersion-cooling engineered liquid (e.g., NOVEC™ 7000 or ELECTROCOOL®) that extracts heat energy generated by the discharging battery cells 212. Once heated by the battery cells 212 to a predefined temperature, the dielectric fluid 240 evaporates. A series of thermally conductive fins 242 are each attached to a respective battery cell 212 inside the module housing 214. These fins 242 thermally couple with the cover 224 of the module housing 214 and, optionally, contact a thermally conductive fin 226 projecting from the cooling chamber 216. Through this mechanical interface, the sublimable cooling agent 220 inside the cooling chamber 216 extracts heat from and cools the fins 242. The cooled thermally conductive fins 242, in turn, contact and condense the evaporated dielectric fluid 240; the condensed, liquid fluid 240 then returns to the liquid volume to extract addition heat energy from the battery cells 212. Each battery cell 212 may be packed inside a wicking jacket 244 to improve surface wetting of the cells 212 and to protect the cells 212 against acceleration and negative g forces. As a further option, a porous insert layer 246 may be inserted between neighboring battery cells 212. The porous insert layer 246, which may be formed from expandable graphite or carbon foam, helps to improve nucleation, facilitate efficient boiling, and reduce charge of the dielectric fluid 240.

Further, the disclosure comprises embodiments according to the following clauses:

Clause 1: a thermal management system for an electrical component, the electrical component stored inside a module housing, the thermal management system including: a cooling chamber configured to movably attach adjacent the module housing, the cooling chamber configured to contain therein a sublimable cooling agent; a biasing member configured to bias the cooling chamber away from the module housing; and a smart material actuator attached to the cooling chamber and configured to thermally interface with the module housing, the smart material actuator being configured to extract thermal energy from the module housing and, once heated to a phase transformation temperature, selectively actuate to thereby move the cooling chamber into contact with the module housing.

Clause 2: the thermal management system of clause 1, wherein the smart material actuator includes a shape memory alloy (SMA) spring mounted to the cooling chamber and configured to attach to the module housing.

Clause 3: the thermal management system of clause 2, wherein the SMA spring includes a pair of SMA helical springs projecting from a module-facing surface of the cooling chamber.

Clause 4: the thermal management system of clauses 2 or 3, further comprising a thermal grease located on a distal end of the SMA spring and configured to contact the module housing.

Clause 5: the thermal management system of any one of clauses 2 to 4, further comprising a thermally insulated stub attached to a proximal end of the SMA spring and interposed between the SMA spring and the cooling chamber.

Clause 6: the thermal management system of any one of clauses 2 to 5, further comprising a hydrophobic melamine foam disposed within the cooling chamber.

Clause 7: the thermal management system of any one of clauses 1 to 6, wherein the sublimable cooling agent includes a solid-form carbon dioxide.

Clause 8: the thermal management system of clause 7, wherein the sublimable cooling agent further includes a non-toxic and non-flammable dry cleaning fluid within which is disposed the solid-form carbon dioxide.

Clause 9: the thermal management system of clause 8, wherein the dry cleaning fluid includes a tetrachloroethylene-based solvent, a petroleum-based hydrocarbon solvent, a trichloroethylene-based solvent, or a combination of two or more thereof.

Clause 10: the thermal management system of any one of clauses 1 to 9, further comprising a plurality of thermally conductive fins attached to the cooling chamber and configured to insert into the module housing to thereby thermally couple the sublimable cooling agent with the electrical component.

Clause 11: the thermal management system of clause 10, wherein the electrical component includes a battery module with multiple battery cells disposed within the module housing and at least partially submerged in a dielectric fluid, the dielectric fluid being configured to extract heat energy from the battery cells and evaporate once heated to a predefined temperature, and wherein the thermally conductive fins are configured to condense the evaporated dielectric fluid upon contact therewith and transfer the extracted heat energy to the sublimable cooling agent.

Clause 12: the thermal management system of any one of clauses 1 to 11, wherein the cooling chamber includes a thermally conductive wall configured to contact and thereby thermally interface with the module housing upon contraction of the smart material actuator.

Clause 13: the thermal management system of any one of clauses 1 to 12, wherein the biasing member is mounted to the cooling chamber and configured to press against the module housing, the biasing member including one or more helical compression springs projecting from a module-facing surface of the cooling chamber.

Clause 14: an aircraft including: an airframe; a rotor assembly and/or a pair of wings attached to the airframe; an electrical system including a battery module with a module housing mounted to the airframe and multiple battery cells disposed within the module housing; and a thermal management system including: a cooling chamber movably mounted to the airframe adjacent the module housing, the cooling chamber containing therein a sublimable cooling agent; a biasing member projecting from a module-facing surface of the cooling chamber and pressing against a chamber-facing surface of the module housing to thereby bias the module housing away from the cooling chamber; and a smart material actuator mounted to the cooling chamber and thermally interfacing with the module housing, the smart material actuator being configured to extract thermal energy from the module housing and, once heated to a phase transformation temperature, selectively contract to thereby pull the cooling chamber into contact with the module housing.

Clause 15: a method of cooling an electrical component, the electrical component stored inside a module housing, the method including: movably attaching a cooling chamber adjacent the module housing, the cooling chamber containing therein a sublimable cooling agent; biasing the cooling chamber away from the module housing via a biasing member; selectively actuating a smart material actuator attached to the cooling chamber by thermally interfacing the smart material actuator with the module housing such that the smart material actuator extracts thermal energy from the module housing; moving the cooling chamber into contact with the module housing via the smart material actuator being heated to a phase transformation temperature and thereby changing shape; and extracting thermal energy from the module housing via the sublimable cooling agent by contacting the cooling chamber with the module housing.

Clause 16: the method of clause 15, wherein the smart material actuator includes a shape memory alloy (SMA) spring mounted to the cooling chamber and configured to attach to the module housing.

Clause 17: the method of clauses 15 or 16, wherein the sublimable cooling agent includes a solid-form carbon dioxide.

Clause 18: the method of clause 17, wherein the sublimable cooling agent further includes a non-toxic and non-flammable dry cleaning fluid within which is disposed the solid-form carbon dioxide.

Clause 19: the method of any one of clauses 15 to 18, wherein the cooling chamber includes a plurality of thermally conductive fins, and wherein extracting thermal energy from the module housing further includes inserting the thermally conductive fins into the module housing to thereby thermally couple the sublimable cooling agent with the electrical component.

Clause 20: the method of clause 19, wherein the electrical component includes a battery module with multiple battery cells disposed within the module housing and at least partially submerged in a dielectric fluid, the dielectric fluid being configured to extract heat energy from the battery cells and evaporate once heated to a predefined temperature, and wherein the thermally conductive fins are configured to condense the evaporated dielectric fluid upon contact therewith and transfer the extracted heat energy to the sublimable cooling agent.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. A thermal management system for cooling an electrical component stored inside a module housing, the thermal management system comprising:
a cooling chamber configured to movably attach adjacent to the module housing and thereby move towards and away from the module housing, wherein the cooling chamber is configured to contain therein a sublimable cooling agent; and
a smart material actuator attached to the cooling chamber and configured to thermally interface with the module housing, wherein the smart material actuator is configured to:
extract thermal energy from the module housing and, once heated to a phase transformation temperature of the smart material actuator by the extracted thermal energy, collapse to thereby allow the cooling chamber to contact the module housing; and
dissipate the extracted thermal energy and, once cooled below the phase transformation temperature, expand to thereby move the cooling chamber away from and out of contact with the module housing.

2. The thermal management system of claim 1, wherein the smart material actuator includes a shape memory alloy (SMA) spring mounted to the cooling chamber and configured to attach to the module housing.

3. The thermal management system of claim 2, wherein the SMA spring includes a plurality of SMA helical springs projecting from a module-facing surface of the cooling chamber.

4. The thermal management system of claim 2, further comprising a thermal grease located on one end of the SMA spring, wherein the thermal grease is configured to contact the module housing and enhance a thermal interface between the SMA spring and the module housing.

5. The thermal management system of claim 2, further comprising a thermally insulated stub located on one end of the SMA spring and interposed between the SMA spring and the cooling chamber to thereby thermally isolate the SMA spring from the cooling chamber.

6. The thermal management system of claim 1, further comprising an insulation jacket configured to cover and thermally insulate the sublimable cooling agent contained within the cooling chamber.

7. The thermal management system of claim 6, wherein the insulation jacket is configured to seat therein and at least partially surround the sublimable cooling agent.

8. The thermal management system of claim 7, wherein the insulation jacket is formed with a polystyrene foam or a paper-based material.

9. The thermal management system of claim 1, wherein the sublimable cooling agent includes a solid-form carbon dioxide, and wherein the cooling chamber is further configured to contain therein a dry cleaning fluid within which is disposed the solid-form carbon dioxide.

10. The thermal management system of claim 1, further comprising a thermally conductive fin attached to the cooling chamber and configured to insert into the module housing to thereby thermally couple the sublimable cooling agent with the electrical component.

11. The thermal management system of claim 10, wherein the electrical component includes a battery module with multiple battery cells disposed within the module housing and at least partially submerged in a dielectric fluid, the dielectric fluid being configured to extract heat energy from the battery cells and evaporate once heated to a predefined temperature, and wherein the thermally conductive fin is configured to condense the evaporated dielectric fluid upon contact therewith and transfer the extracted heat energy to the sublimable cooling agent.

12. The thermal management system of claim 1, wherein the cooling chamber includes a thermally conductive wall configured to contact and thereby thermally interface with the module housing upon collapse of the smart material actuator.

13. The thermal management system of claim 1, further comprising a pressure relief valve attached to the cooling chamber and configured to vent therefrom gaseous byproducts of the sublimable cooling agent.

14. An aircraft comprising:
an airframe;
a rotor assembly and/or a pair of wings attached to the airframe;
a battery module including a module housing attached to the airframe and multiple battery cells disposed within the module housing; and
a thermal management system including:

a cooling chamber movably attached to the module housing to thereby move towards and away from the module housing, wherein the cooling chamber is configured to contain therein a sublimable cooling agent; and a smart material actuator interposed between and attached to the cooling chamber and the module housing, wherein the smart material actuator is thermally coupled with the module housing and is configured to:

extract thermal energy from the module housing and, once heated to a phase transformation temperature of the smart material actuator by the extracted thermal energy, collapse to thereby allow the cooling chamber to descend, under the force of gravity, into contact with the module housing; and dissipate the extracted thermal energy and, once cooled below the phase transformation temperature, expand to thereby push the cooling chamber away from and out of contact with the module housing.

15. A method of assembling a thermal management system for cooling an electrical component stored inside a module housing, the method comprising:

movably attaching a cooling chamber adjacent the module housing such that the cooling chamber selectively moves towards and away from the module housing;

inserting a sublimable cooling agent into the cooling chamber;

attaching a smart material actuator to the cooling chamber; and

thermally interfacing the smart material actuator with the module housing, wherein the smart material actuator is configured to:

extract thermal energy from the module housing and, once heated to a phase transformation temperature of the smart material actuator by the extracted thermal energy, collapse to thereby allow the cooling chamber to contact the module housing; and dissipate the extracted thermal energy and, once cooled below the phase transformation temperature, expand to thereby move the cooling chamber away from and out of contact with the module housing.

16. The method of claim 15, wherein the smart material actuator includes a shape memory alloy (SMA) spring mounted to and interposed between the cooling chamber and the module housing.

17. The method of claim 15, wherein the sublimable cooling agent includes a solid-form carbon dioxide.

18. The method of claim 17, further comprising inserting a dry cleaning fluid into the cooling chamber such that the solid-form carbon dioxide is disposed within the dry cleaning fluid.

19. The method of claim 15, further comprising covering at least a portion of the sublimable cooling agent with an insulation jacket.

20. The method of claim 15, further comprising attaching a pressure relief valve to the cooling chamber, wherein the pressure relief valve is configured to vent gaseous byproducts of the sublimable cooling agent from the cooling chamber.

* * * * *